(12) United States Patent  
Dunning et al.

(10) Patent No.: US 7,176,542 B2  
(45) Date of Patent: Feb. 13, 2007

(54) PHOTO INDUCED-EMF SENSOR SHIELD

(76) Inventors: Gilmore J. Dunning, 504 Highway St., Newbury Park, CA (US) 91320; Marko Sokolich, 432 Denslow Ave., Los Angeles, CA (US) 90004; Deborah Vogel, 14917 Marquette St., Moorpark, CA (US) 93021; David M. Pepper, 3925 Latigo Canyon Rd., Malibu, CA (US) 90265

( * ) Notice: Subject to any disclaimer, the term of this patent is extended or adjusted under 35 U.S.C. 154(b) by 64 days.

(21) Appl. No.: 10/830,540

(22) Filed: Apr. 22, 2004

(65) Prior Publication Data

US 2005/0236686 A1 Oct. 27, 2005

(51) Int. Cl.
*H01L 31/0232* (2006.01)
(52) U.S. Cl. ............... 257/435; 257/435; 257/457; 257/E27.125
(58) Field of Classification Search ........... 257/435, 257/457, E27.125
See application file for complete search history.

(56) References Cited

U.S. PATENT DOCUMENTS

| 5,451,769 A | 9/1995 | Mc Adoo et al. | 250/214.1 |
| 5,512,763 A | 4/1996 | Allam | 257/21 |
| 6,157,035 A | 12/2000 | Kuijk et al. | 250/370.14 |
| 6,342,721 B1 | 1/2002 | Nolte et al. | 257/448 |

FOREIGN PATENT DOCUMENTS

JP 359089473 A * 5/1984 ............ 257/435

OTHER PUBLICATIONS

Abstract of Coy, J.A., et al., "Scaling Limit In High Multiplicity Photo-EMF Adaptive Photoreceivers," INTERNET: <http://www.ieeexplore.ieee.org/search97/s97is.vts?action=View&VdkVgwKey=http%3A%2F%2Fjohnson%2Eieee%2Eorg$2F1pdocs%2Fconferences%2FA5F906780&DocOffset=5&Docsfound=21&QueryZip=...>1 page total (May 7, 2002).
Abstract of Dunnning, G.J., et al., "Optimizing The Photo-Induced-EMF Response for Broadband Remote Sensing," INTERNET: <http://www.ieeexplore.ieee.org/search97/s97is.vts?action=Viw&VdkVgwKeyhttp%3A%2F%2Fjohnson%2Eieee%2Eorg%2F1pdocs%2Fconferences%2Fa%5F676595&DocOffset=12&DocsFound=21&QueryZip...>1 page total (May 7, 2002).
Klein, M., et al., "Photo-Emf Detector Enables Laser Ultrasonic Receiver," *Optoelectronics World*, 3 pages total (Aug. 2000).
Klein, M., et al., "Recent Advances In Adaptive Receivers For Laser-Generated Ultrasound," *NDT.net* INTERNET: <http://www.ndt.net/article/v05n06/klein/Klein.htm>vol. 5, No. 6, pp. 1-4 (Jun. 2000).

* cited by examiner

*Primary Examiner*—Mai-Huong Tran

(57) ABSTRACT

A photo-EMF detector including a shield to prevent a portion of the detector from illumination. The shield prevents the generation of unwanted noise-currents, thus increasing the performance of the photo-EMF detector.

27 Claims, 6 Drawing Sheets

INTENSITY             SPACE CHARGE
                          FIELD (PRIOR ART)        (PRIOR ART)

PHOTO INDUCED-EMF SENSOR SHIELD

STATEMENT OF GOVERNMENT INTEREST

This invention was made with Government support under Contract No. F33615-95-2-5245 awarded by AFRL/DARPA. The Government has certain rights in this invention.

CROSS REFERENCE TO RELATED PATENTS AND APPLICATIONS

This application is related to the disclosure of U.S. Pat. No. 6,342,721, the disclosure of which is hereby incorporated herein by reference.

This application is related to the disclosure of U.S. patent application No. 60/658,956 entitled "Method and Apparatus for Reduction of Non adaptive Signals in Photo-EMF Sensors".

BACKGROUND OF THE INVENTION

1. Field of the Invention

The present invention relates to photo induced-electromotive force (EMF) detectors. More particularly, the present invention relates to electrode design and processing, which shields the depletion region adjacent to the electrodes from optical radiation.

2. Description of Related Art

Conventional photodetectors typically generate a signal that is proportional to the power of an incident beam of light. Recently, a new photodetector has been developed based on non-steady-state photo-electromotive force (photo-EMF). A photo-EMF detector generates an output signal proportional to the transient lateral motion of an incident optical pattern on its surface. When the pattern is stationary, no output signal is produced, regardless of the location or amount of incident power.

A conventional photo-EMF sensor resembles a conventional semiconductor detector; however, it develops an internal lateral electric field that stores the spatial intensity pattern of an incident optical beam. FIG. 1a shows a conventional photo-EMF sensor 100 comprising a detection substrate 110 and a pair of surface electrodes 120. FIG. 1b also shows the intensity pattern 150 of an incident laser beam 152 while FIG. 1c depicts the resulting lateral internal space charge field 160 developed in the material between the electrodes 120 shown in FIG. 1a. The detection substrate 110 may comprise gallium arsenide and the surface electrodes 120 may comprise a titanium/gold alloy.

A photo induced-EMF effect is generated when two coherent optical beams are directed to interfere at the detector. Typically, one of the beams (the probe) contains both temporal (desirable information) and spatial phase content. The second beam (a reference beam) is usually a plane wave or a wavefront with a smoothly varying phase and is typically relatively constant in time and space. At the detector surface the probe beam interferes with the reference beam producing an interference fringe pattern. Photo-generated carriers are then produced which diffuse away from regions of intense optical radiation. These carriers become trapped and form a periodic charge pattern and the corresponding space-charge field. At steady state, (i.e., in the absence of any change to the interference pattern) the space charge field is static and there is no net current between the electrodes. However, when the phase of the probe beam is modulated rapidly (relative to the space-charge formation time), the interference fringes move relative to the initial stationary space charge field grating and induce a net current or photo-EMF. For phase changes comparable to the response time of the detector material, the space charge gratings track the motion of the intensity pattern across the material, resulting in no new current being produced. Therefore, the output current as a function of time from the detector is proportional to the phase modulation. The frequency response may be as high as several hundred MHz to GHz and is constrained by the carrier recombination time of the material, the grating fringe spacing and signal-to-noise considerations.

A photo-EMF detector is commonly used to measure ultrasonic waves in materials, just as a conventional contact piezoelectric ultrasonic transducer (PZT) does, but without contacting the sample under inspection. The special properties of a photo-EMF detector permit in-process ultrasonic inspection in industrial environments where background vibrations, rough surfaces, high temperatures, and rapid process motions prevent contact PZTs and traditional laser interferometers from being used.

In addition, a photo-EMF detector may also be used in optical communication for free-space links, optical fiber busses, which may be used over terrestrial and satellite networks. Further, a photo-EMF detector may be used in optical remote sensing applications, where phase-encoded information is to be detected, or in laser based process control including composite cure monitoring and quality assurance.

In a laser-ultrasound probing system, the dynamic phase shift may be the result of motion in a probed surface. In a laser communication receiver, the motion may be due to phase modulation encoded onto a light beam. The photo-EMF sensor is adaptive, since static and slowly varying changes, such as those due to beam wander, vibrations, thermal effects, turbulence, are adaptively tracked. The photo-EMF sensor will produce no current for such changes, as long as the space-charge field formation time is faster than the changes. Thus, the photo-EMF sensor can adaptively compensate for the effects due to these changes. This adaptive compensation capability makes the photo-EMF sensor extremely attractive for many applications, since the sensor detects high frequency information, while suppressing low frequency noise.

In prior art photo-EMF systems, continuous wave (CW) light incident on the detector's sensitive surface near the electrodes produces a photocurrent that contributes to the noise. This noise current is additive to the desired time modulated signal and directly reduces the signal-to-noise ratio. This current can be a particularly significant source of noise if the illumination energy is above the bandgap because most of the light is absorbed very close to the surface (~μm). This implies that the depth of the surface depletion region arising from Fermi level pinning can be on the same order as the absorption depth for photon energies above the band gap. The effect of photocurrent generated near the electrode can be divided into two distinct cases, continuous wave (CW) and temporally modulated illumination. In the first case, CW light incident on the depletion region near the electrodes produces a DC current. This current is converted into a voltage by a transimpedance amplifier and further amplified by additional gain stages. When the unwanted DC offset is amplified by subsequent gain stages the final stages of amplification can become saturated or the dynamic range of the amplifier can be severely restricted. When the amplifier chain performance is degraded in this manner it directly affects the dynamic range of the sensor.

In the second case, the performance of the sensor can be impaired because of amplitude modulation (AM) illumination from one of the beams incident on the depletion region. This AM light produces a temporally modulated current that cannot be distinguished from the desired signal produced by the phase modulation of the probe beam. Because the currents are additive, the AM noise is added to the signal and therefore reduces the overall sensor signal-to-noise ratio. The AM modulation can be due to speckle effects, beam dropouts or severe beam wander; in all cases, this modulation is undesirable.

Therefore, there exists a need in the art for a method and apparatus that will reduce the noise generated near the electrodes of a photo-EMF sensor.

SUMMARY OF THE INVENTION

In one aspect the present invention comprises a photo-EMF detector having: (i) a substrate, the substrate having a first portion capable of receiving illumination; (ii) at least two electrodes in contact with said substrate, said at least two electrodes being disposed on either side of, but spaced from, said first portion of said substrate; and (iii) at least two shields for shielding the substrate from illumination, each said shield being associated with one of said at least two electrodes and each said shield being disposed over said substrate, adjacent said first portion and adjacent a point where its associated electrode contacts this substrate.

In another aspect the present invention comprises a method for reducing noise in a photo-EMF detector comprising: (i) creating a region on a substrate where an electrode is electrically connected with said substrate; and (ii) shielding a portion of a substrate from illumination, said portion of said substrate being located adjacent said region on said substrate where said electrode is electrically connected with said substrate and a portion of said substrate to be illuminated.

BRIEF DESCRIPTION OF THE DRAWINGS AND TABLES

Figures

Tables

Table I is a table of layer dimensions for the first embodiment of the present invention;

Table II is a table of layer dimensions for the second embodiment of the present invention; and Table III provides a table of layer dimensions for the third embodiment of the present invention.

DETAILED DESCRIPTION OF PREFERRED EMBODIMENTS

The present invention will now be described more fully hereinafter with reference to the accompanying drawings, in which preferred embodiments of the invention are shown. This invention may be embodied in many different forms and should not be construed as limited to the particular embodiments set forth herein.

As discussed above, a significant source of noise results from an undesirable photocurrent being generated in the depletion region of the photo-EMF detector near the electrodes. The performance of a photo-EMF detector is improved by reducing the generation of the undesirable photocurrent in accordance with the present invention. The discussion presented herein will first focus on the embodiments of the present invention, followed by a specific example of one process and specific dimensions for a photo-EMF detector produced in accordance with the present invention.

In an ideal photo-EMF detector, illuminating the detector's entire active area between its two metal electrodes with coherent light from a probe beam and a reference beam generates an optimum signal current. The detector's active area is equal to the length of one of the two metal electrodes times the distance separating the two metal electrodes. The noise described above is generated only in the depletion region near the metal electrodes, i.e., a few μm times the length of the electrode (which is usually measured in mm). This area of the substrate near the metal electrodes, also known as the depletion region, represents an extremely small fraction of the total active area over which the current is produced. Therefore, by shielding only a small portion of the substrate near the interface of the substrate with the metal electrodes, the signal-to-noise ratio performance of the sensor can be substantially improved, since there is only a small reduction in signal concurrent with a large reduction in noise.

The present invention is directed to techniques for inhibiting the generation of a photocurrent in the depletion region of the photo-EMF detector near its electrodes. Several embodiments of the invention are disclosed.

Figure 1A:
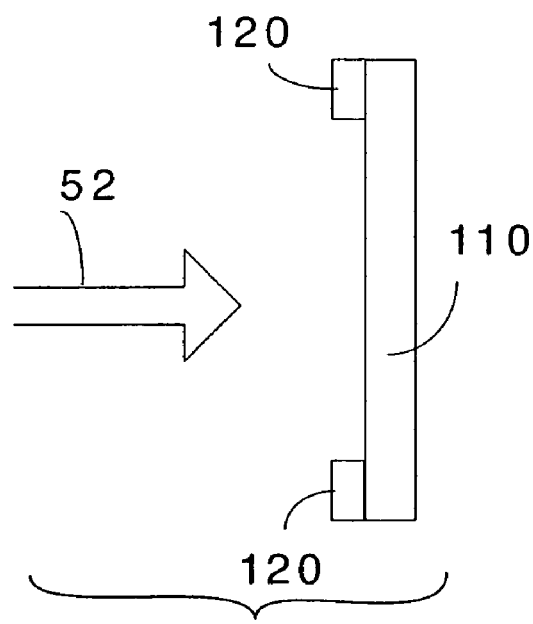
FIG. 1a depicts a conventional (prior art) photo-EMF sensor.
Figures 1B, 1C:
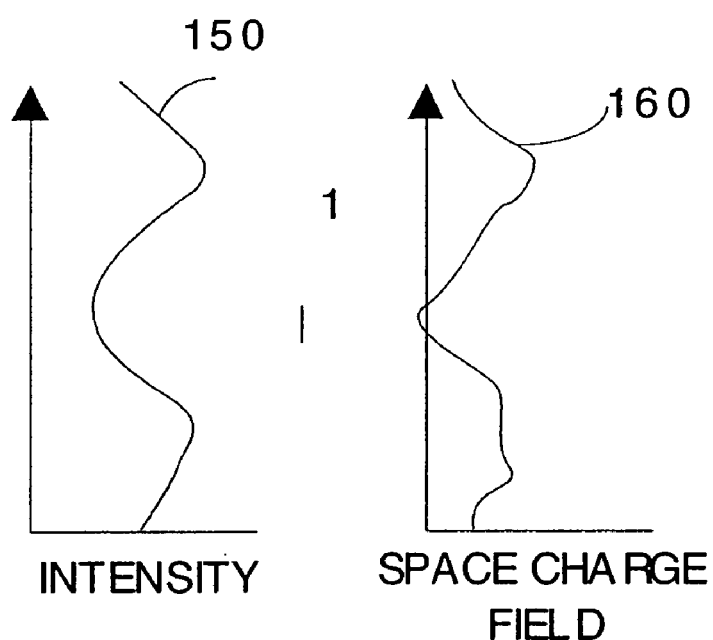
FIG. 1b is a graph of the intensity pattern of a possible incident laser beam.
FIG. 1c is a graph of the resulting lateral internal space charge field developed in the material between the electrodes shown by FIG. 1a in response to the intensity pattern of FIG. 1b.
Figure 2:
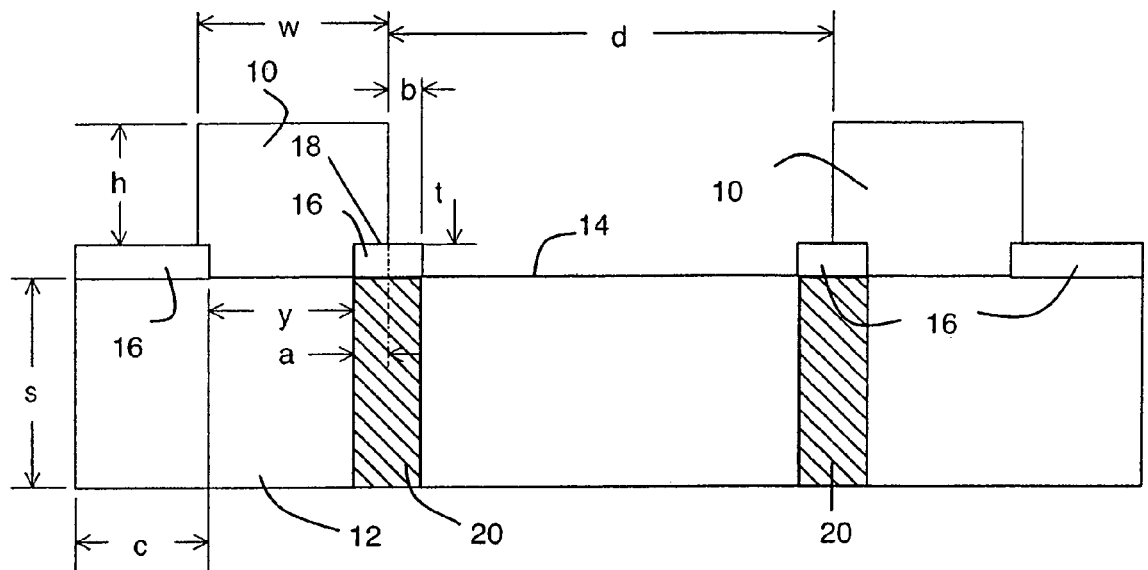
FIG. 2 depicts a cross-section of a first embodiment of the present invention.
Figure 3:
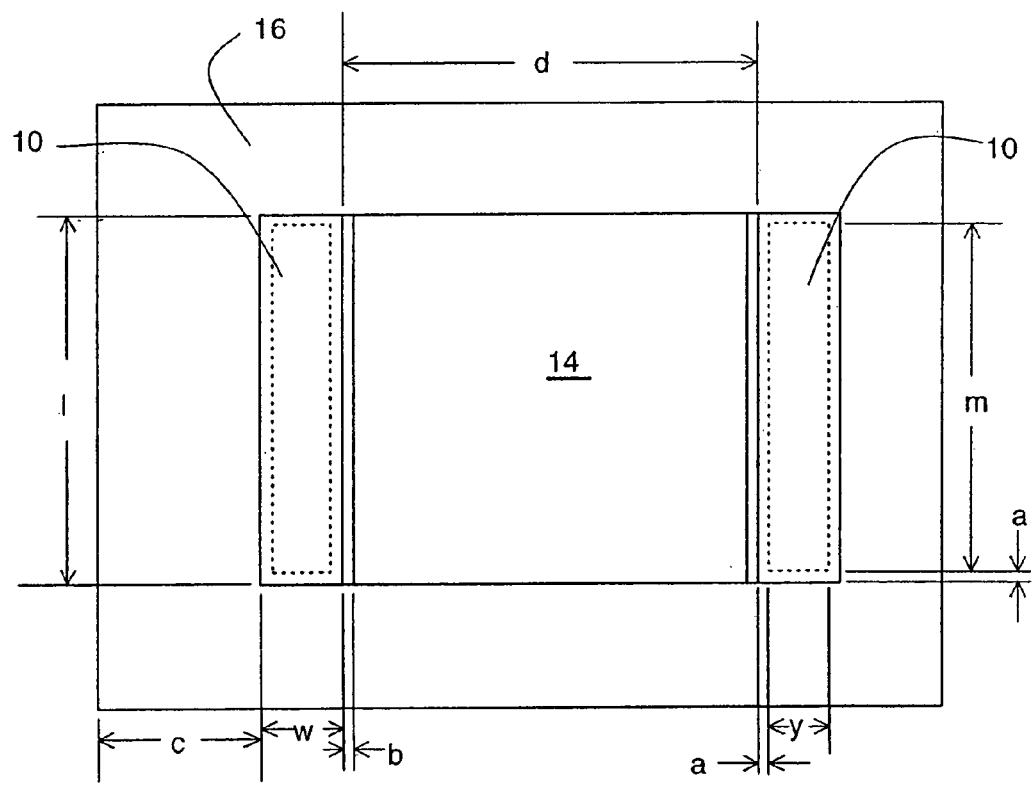
FIG. 3 depicts a top-down view the first embodiment of the present invention.

FIGS. 2 and 3 show a first embodiment of the present invention. FIG. 2 depicts a cross-section of a photo-EMF detector, while FIG. 3 depicts the corresponding top-down or plan view thereof. In FIG. 2, a substrate 12 is the foundation for all of the layers of the detector. The substrate 12 material generates a photocurrent when illuminated and may comprise, for example, materials such as to GaAs and GaAs:Cr epitaxial layers and multiple Quantum Well structures. A guard oxide layer 16 is used to define a shield having a width "a+b", in this embodiment, over the depletion region immediately adjacent the metal electrodes 10. Each shield 16 shields the underlying substrate from incident light thereby defining a shielded region 20 therein (depicted with hatch lines for ease of identification). The guard oxide layer 16 also may undercut the peripheries of the metal electrodes 10 by a distance "a". The guard oxide layer 16 has a thickness "t", is preferably laid down in contact with substrate 12 and is preferably not transparent at the illumination wavelength. The detector's collection area 14, has a length "l" and a width equal to "d−2·b". The detector's collection area 14 has been reduced slightly due to the presence of the guard oxide layer 16 near the electrodes 10. Any photons impinging on the detector collection area 14 will produce photo-generated carriers.

The overall electrode 10 dimensions are "l" in length and "w" in width. However, the active area of the electrodes 10, the region that collects current, is "y" in width by "m" in length, due to the undercutting by a portion of the guard oxide layer 16. An opening (with dimensions y, m) in the nonconductive guard oxide layer 16 defines where a given metal electrode 10 contacts substrate 12 and thus defines the active region of the metal electrodes 10. The guard oxide layer 16 dimensions, parallel to the substrate 12 surface, are preferably selected to maintain an inactive region (having a width "a") within the perimeter of the metal electrodes 10. The dimensions of the guard oxide layer 16 adjacent to the metal electrode 10 and the detector collection area 14 is at least "l" in length and preferably "a+b" in width. To ensure that the electrode 10 will collect the carriers produced, the dimension "a+b" is selected to be less than the diffusion length of the carrier of the material.

As can be seen, over the distance "a+b" (i) the substrate is shielded from illumination by a light source due to the opaque nature of oxide 16 and (ii) due to the fact that the detector collection area 14 is spaced by this distance from the metal-to-substrate contact of the electrode 10. Additionally, the electrode 10 overhangs the substrate by the distance "a", and since the incident light is typically perpendicular to the surface of substrate 12, the presence of the overhang 18 also acts as a shield.

With the presence of the opaque mask 16, the existence of overhang 18 is optional and thus the distance "a" can be equal to zero. Indeed, overhang 18 may occur simply due to manufacturing considerations.

It should be understood that instead of the guard oxide layer 16 being opaque to the illumination wavelength, the thickness "t" of the guard oxide layer 16 might be such that the guard oxide layer 16 is transparent or translucent at the wavelength of the incident illumination. In this situation, the guard oxide 16 between the substrate 12 and the electrode 10 under the overhang 18 defines a portion of the substrate 12 that is neither illuminated nor in contact with the electrode 10 and thus is shaded and inactive. This inactive section of the substrate 12 is indicated by the width "a" in FIG. 2. The inactive section of the substrate 12 reduces the generation of the undesirable photocurrent, thus increasing the performance of the photo-EMF sensor, due to the shadowing effect of the overhang 18 at the edges of the detector collection area 14.

Figure 4:
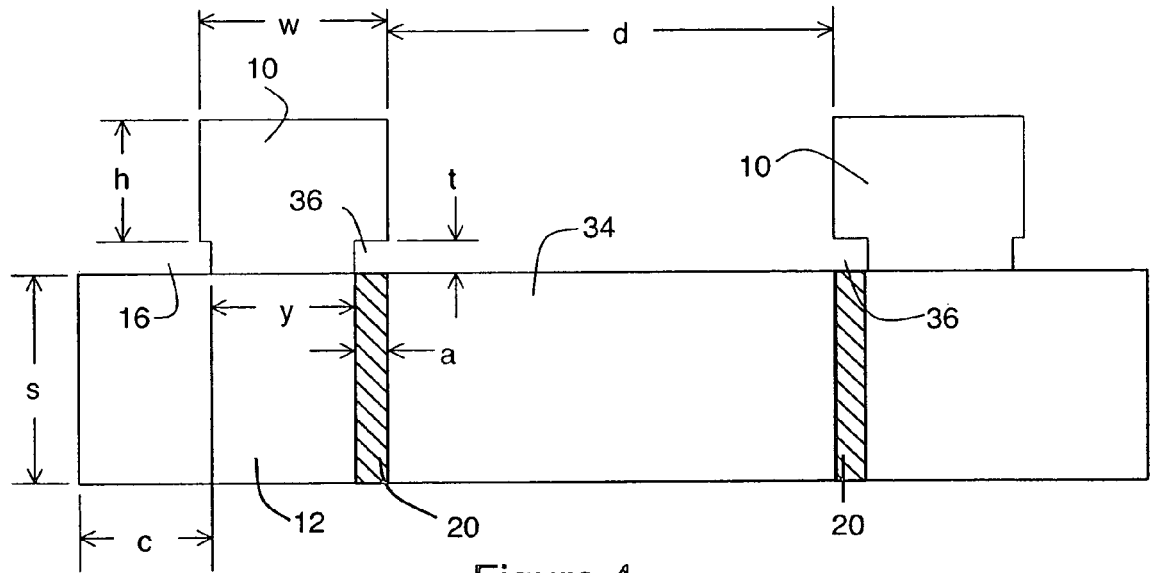
FIG. 4 depicts a cross-section view of a second embodiment of the present invention.
Figure 5:
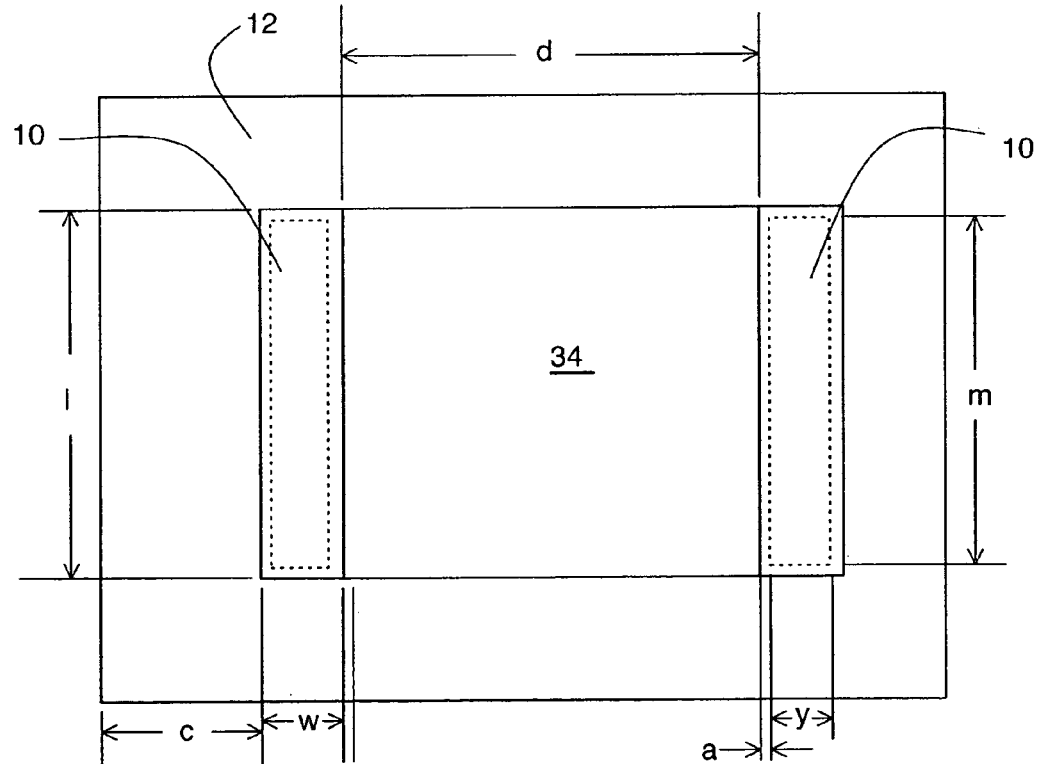
FIG. 5 depicts a top-down view of the second embodiment of the present invention.

A second embodiment is shown in FIGS. 4 and 5. FIG. 4 depicts a cross section and the corresponding top-down view is shown in FIG. 5. This geometry is similar to the first embodiment; however, instead of using an insulating guard oxide layer 16 to define the active areas of the electrodes 10, a sacrificial material 38 is used instead. This material 38, e.g. oxide, is removed after the electrodes 10 have been disposed on the substrate 12, resulting in a gap 36 between the substrate 12 and the electrode 10. In this embodiment, the overhang 18 formed by electrode material 10 acts as a shield to provide shielded, inactive region 20, on the substrate 12 in which no carriers are generated. The shielded 20 regions are depicted with hatch lines for ease of identification.

In this embodiment, the detector's collection area 34 is "l" in length and "d" in width. The overall metal electrode 10 dimensions are "l" in length and "w" in width. Because the electrode material 10 is not in contact with the substrate 12 at the detector collection area 34 where the sacrificial material 38 is removed, the sacrificial material 38 defines the active region of the electrodes 10. Therefore, the active area of the electrodes 10, which collects current, is "y" in width by "m" in length. The sacrificial material 38 is preferably laid down in contact with the substrate 12 material and has a thickness of "t". The sacrificial material 38 dimensions, parallel to the major surface of substrate 12, are designed to maintain an inactive region (equal to the depletion region) within the perimeter of the metal electrodes 10. The dimensions of the sacrificial material 38 adjacent the metal electrode 10 and the detector collection area 24 are at least "l" in length and "a" in width. The dimensions of the resulting gap 36 are "l" in length and "a" in width. To ensure that the metal electrode 10 will collect the carriers produced, the dimension "a" is chosen to be less than the diffusion length of the carrier in the material. Since the sacrificial material 38 is removed during the manufacture of the detector, to ensure that the electrode 10 will collect the carriers produced, the dimension "a" is selected to be less than the diffusion length of the carrier of the material. Electrodes 10 overhang the substrate by the distance "a", and since the incident light is typically perpendicular to the surface of substrate 12, the presence of the overhang 18 acts as a shield (see shielded region 20) against photons impinging on the depletion region immediately adjacent electrodes 10.

In a third embodiment of this invention, a layer is preferably deposited directly over the active area of the detector element. This optically transparent layer can serve two desirable functions: (1) It provides a protective layer to minimize degradation of the sensor over time, which may be caused by defects in the surface region which effects the carrier recombination rate; and (2) it can be used as an anti-reflection coating, which can enhance the performance of the detector by about 30%, owing to the elimination of Fresnel reflections, as well as undesirable secondary interference fringe patterns on the detector, which may be generated by successive reflections within the layer.

Figure 6:
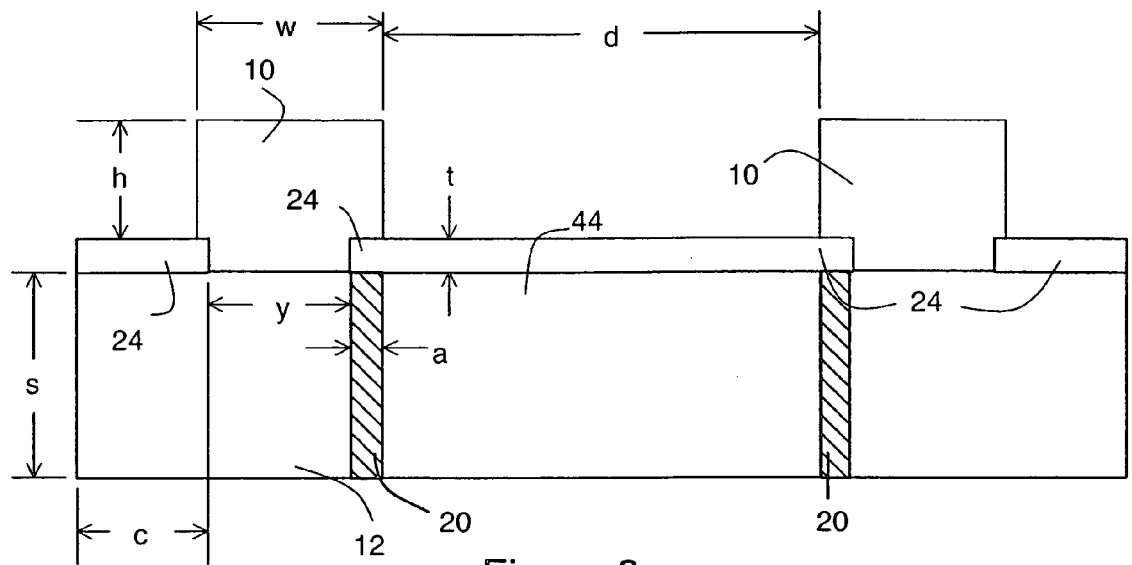
FIG. 6 depicts a cross-section view of a third embodiment of the present invention.
Figure 7:
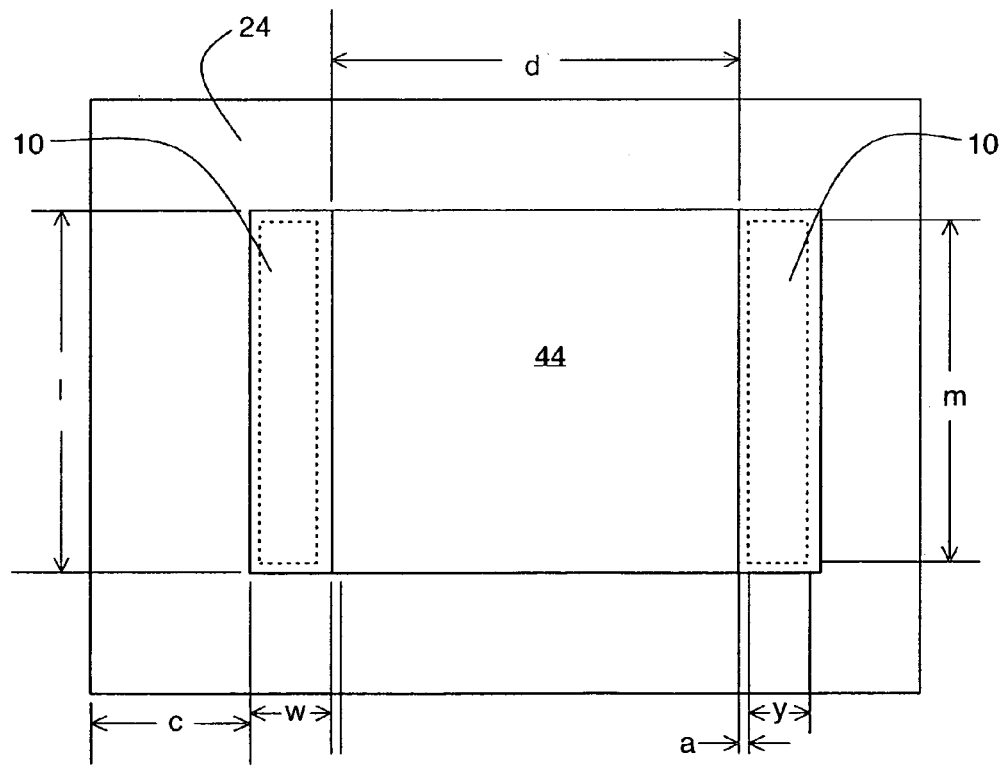
FIG. 7 depicts a top-down view of the third embodiment of the present invention.

The third embodiment is shown in FIGS. 6 and 7. In FIG. 6 the detector is shown in cross section and the corresponding top-down view is shown in FIG. 7. Referring to FIG. 6, the substrate 12 material generates a photocurrent when illuminated. The device collection area 44 is "l" in length and "d" in width and is defined by the electrodes 10. This implies that any photons impinging on this region will produce photo-generated carriers. The overall electrode 10 dimensions are "l" in length and "w" in width. However, the active area of the electrodes 10, the region which collects current, is "y" in width by "m" in length, due to the presence of the transparent, nonconductive layer 24 between a portion of the electrode 10 and the substrate 12. The transparent, nonconductive layer 24 is preferably laid down in contact with the substrate 12 and has a thickness of "t". The transparent, nonconductive layer 24 dimensions are selected to maintain an inactive region (equal to the depletion region)

within the perimeter of the electrode 10 by providing an insulator. The dimensions of the transparent, nonconductive layer 24 adjacent to the electrode and the detector collection area 44 is at least "l" in length and "d+2·a" in width. Again the dimensions are chosen to be less than the diffusion length of the carrier in the material insuring that the electrodes 10 will collect the carries produced.

In the third embodiment of the device, the transparent, nonconductive layer 24 may be an oxide layer. The oxide layer performs two functions. The first function is to provide a shielded, inactive region 20 in the substrate while the second function is to provide an anti-reflection coating. If the oxide layer thickness is judiciously chosen to be an odd number of ¼ wavelengths of the illumination light, then the coating will also serve as an antireflection coating. Thus, the oxide layer is transparent to the wavelength of light to be sensed by the detector. This will increase the sensitivity because it will increase the number of carriers generated above the background of thermally excited carriers from a given laser illumination power. This effectively has the possibility of reducing the power requirements on the laser which usually also means a reduction in laser cost. Because the two functions are combined in one step it also reduces the processing cost. Moreover, by proper choice of this layer, its presence can minimize spurious interference fringes from occurring, due to successive Fresnel reflection through the layer. Finally, this layer is designed to inhibit the formation of the deleterious surface defect states at the interface of the sensor's active area. The formation of these defect states has been postulated to result in a gradual degradation of the detector's performance over time. One skilled in the art will appreciate that, in addition to an oxide layer, the transparent protective layer can also be in the form of a quarter-wave-length semiconductor epilayer (e.g. AlGaAs) whose bandgap is chosen to be greater than the photon energy of the incident laser light, which can be lattice-matched to the detector's active area (e.g., a GaAs epilayer or a superlattice).

In this third embodiment, the material electrode 10 acts as a shield to provide a shielded, inactive region 20 of width "a", on the substrate 12 in which no carriers are generated.

Figure 8:
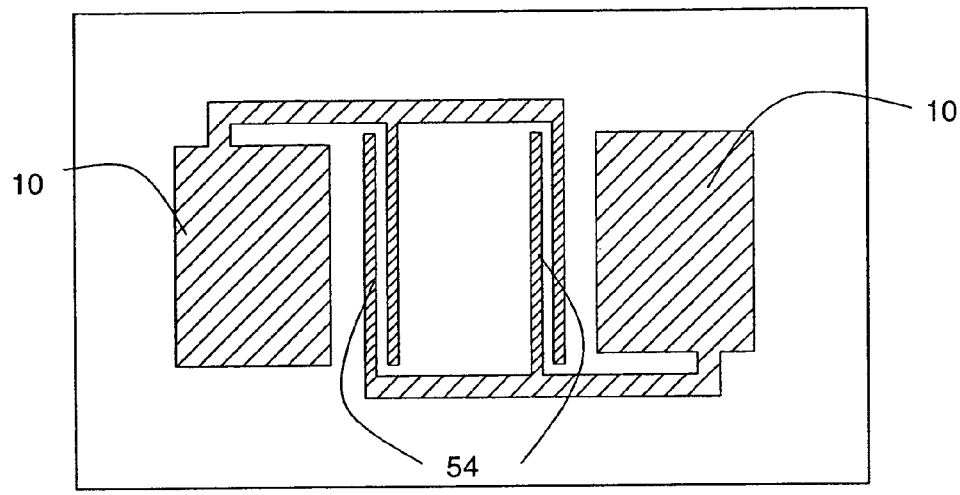
FIG. 8 depicts a top-down view of another electrode arrangement modified in accordance with the first embodiment of the present invention.
Figure 9:
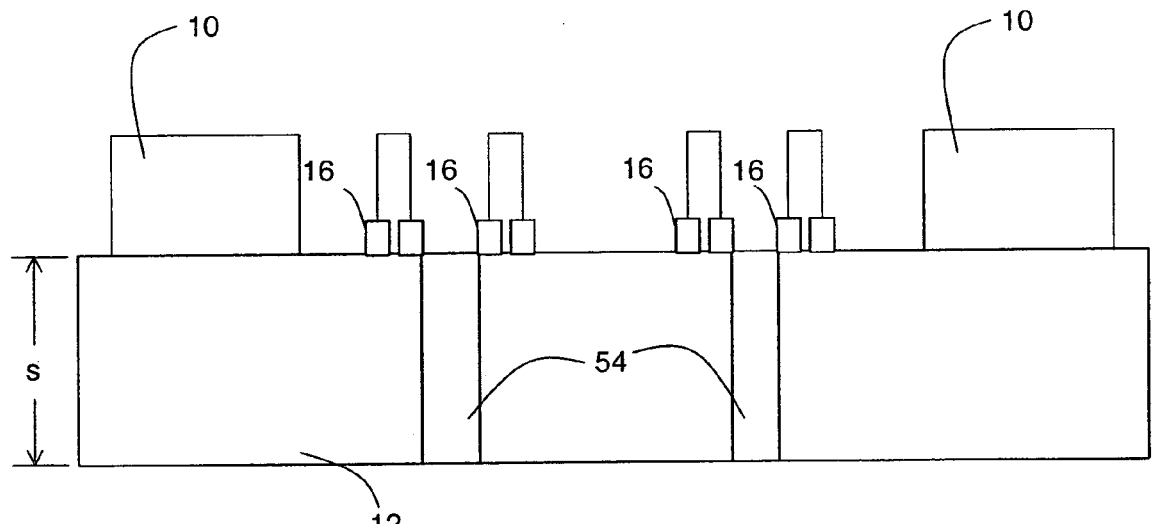
FIG. 9 depicts a cross-section view of the other electrode arrangement modified in accordance with the first embodiment of the present invention.

While the above discussion depicts only two electrodes, the present invention may be practiced with any number of electrodes 10, which electrodes may be interlaced. For example, U.S. Pat. No. 6,342,721 to Nolte et al, herein incorporated by reference discloses a photo-EMF detector having a substrate and a plurality of interlaced electrode pairs disposed over the substrate. FIGS. 8 and 9 depict how the invention in U.S. Pat. No. 6,342,721 may be modified in accordance with the first embodiment of the present invention. One skilled in the art will appreciate that U.S. Pat. No. 6,342,721 may easily be modified in accordance with the second and third embodiments as well.

FIG. 8 depicts a top-down view of the arrangement of the electrodes 10. This arrangement results in two collection regions 54. FIG. 9 depicts a cross-sectional view of the arrangement of FIG. 8. The electrodes 10 are disposed on a substrate 12. Following the details specified in the discussion of the first embodiment, a layer of guard oxide 16 is disposed on the substrate 12 wherein a portion of the guard oxide 16 is between the substrate and the electrodes 10. The result is that the collection region 54 is reduced from being the entire substrate 12 between the electrodes 10 to the portion of the substrate between the portions of the guard oxide layer 16.

The implementation of a sensor with an inactive area in accordance with the present invention consists of several steps taken while processing the device. Photolithographic processes are routinely used in semiconductor wafer fabrication. These well known techniques require a method for forming accurate patterns on substrates. These patterns delineate the area for subsequent doping, etching, interconnection and metallization. The photolithographic process consists of producing a mask with the required circuit pattern for a given level and transferring that pattern, using an optical technique into a photoactive polymer known as a photo-resist. Ultraviolet light in the wavelength region of 350–430 nm is typically used. Contact printing, step-and-repeat, and proximity printing are common photo-resists exposure techniques.

Deposition of a dielectric material (onto a substrate that is under high vacuum) is a traditional processing step that may be used to form a nonconductive layer with a high resistance to the flow of electric current. This is done to form electrical isolation of an element, for example a monolithic integrated circuit, by surrounding the elements with an insulation barrier such as a semiconductor oxide. Deposition of a dielectric material with the correct thickness may also be used to form the antireflection coating. This antireflection coating can be a separate processing step applied to the region between the electrodes. Alternatively, the electrically insulating coating designed to form the guard can be combined with the antireflection coating using the appropriate photolithographic mask.

While there are many well-known processes in the art for manufacturing photo-EMF detectors, an example of one method for manufacturing is set forth below. One skilled in the art will appreciate that other methods may be modified in a similar manner in order to obtain the photo-EMF detectors as described above. In Tables I, II and III exemplary dimensions are given for each layer of the first embodiment, the second embodiment, and the third embodiment respectively. For these dimensions, the assumed illuminating lasers are a double Nd Yag laser at 532 nm and an Arum laser at 514 nm. One skilled in the art will appreciate that the illuminating lasers are typically above the bandgap of the substrate material, such as GaAs. However, if a laser below the bandgap of the substrate is to be used, then the electrodes 10 are preferably disposed parallel to one another on the sides of the substrate material 12 as depicted in the embodiment of FIGS. 13a–13c, discussed below, First, a semiconductor wafer, which preferably provides many substrates 12 when later separated, is cleaned using suitable solvents known to those skilled in the art. The semiconductor wafer may be a GaAs wafer; however, other semiconductor wafers may be used. One skilled in the art will appreciate that the wavelength of the illuminating laser will determine the semiconductor wafer material. Additionally, the thickness of the semiconductor material should be greater than the absorption depth. Second, an oxide base is preferably formed by evaporating silicon oxide onto the wafer at high vacuum. Next, a photo-resist adhesion promoter is preferably applied to the wafer. Then, a photo-resist that will be used as an etch mask is deposited onto the promoter-treated oxide surface of the wafer. The resist is then softbaked. Next, an applicable photolithography mask is exposed to define the oxide pattern in the appropriate regions. The resist is then developed. Next, the oxide is etched away to reveal the active photo-detector region 14. Then, a second photo-resist layer is applied to the wafer 12. The second layer of photo-resist is exposed using a photolithography mask with the electrode pattern. The photo-resist is then developed to facilitate formation of electrode metallization 10 for the wafer 12. The metal may be deposited by evaporation at high vacuum. Examples of metals that may be used are pure gold (Au), AuTi, NiAuGe, Ni, and platinum. The unnecessary metal is lifted off, resulting in some regions of the electrode being insulated from the substrate by the oxide. This process defines the conducting regions of the metal electrodes 10 with the substrate 12. Simultaneously this step also defines the photo induced-EMF detector active area 14, 34, 44. The metal electrodes 10 are diffused into the substrate 12 by subjecting the wafer to a high temperature (thereby annealing it) to provide a better contact resistance between the substrate 12 and the metal electrodes 10. The individual detector elements are then separated from the wafer and attached to the front-end of the sensor electronic amplifier chain preferably using Au wire bonds.

For the second embodiment where sacrificial material is used, an example of a manufacturing process is similar to the example provided above, with a few additional steps. After the silicon oxide is evaporated onto the wafer under high vacuum to form the oxide base, the sacrificial material is then deposited. Then after the metal electrodes 10 are diffused into the substrate 12 by placing the wafer in a high temperature (thereby annealing it) to provide for the better contact resistance between the wafer and the metal electrodes 10, the sacrificial material is removed. The removal of the sacrificial material provides a gap between the metal electrodes 10 and the substrate 12 thereby eliminating a conductive path in that region.

One skilled in the art will appreciate that most of the process steps used in creating the device of FIG. 2 are the same as the steps used to create the device of FIG. 6. One difference is that in order to create the device in FIG. 6, the thickness of the transparent layer 24 needs to be such that the layer is transparent at the incident wavelength. For example, if oxide is used as the transparent layer 24, then the thickness of the oxide should be a multiple of the wavelength of the incident light divided by 4. Another difference is that during the etching process, the transparent layer 24 is not etched in the area between the electrodes.

TABLE I

| Layer Name | Formula | Dimensions |
| --- | --- | --- |
| Oxide Layer - Active Side | (a + b) × l × t | 10.0 μm × 2.0 μm × 0.30 μm |
| Oxide Layer - Exterior | c × l × t | 12.0 μm × 2.0 μm × 0.30 μm |
| Detector Active Volume | d × m × t | 1.996 mm × 1.996 mm × 628 μm |
| Electrode | w × l × h | 0.4 mm × 2.0 mm × 1.2 μm |
| Electrode Active Area | y × m | 0.392 mm × 1.996 mm |
| Substrate | s | 628 μm |
| Alignment Tolerance | b | 2.0 μm |

TABLE II

| Layer Name | Formula | Dimensions |
| --- | --- | --- |
| Oxide Layer - Active Side | (a + b) × l × t | 10.0 μm × 2.0 μm × 0.30 μm |
| Oxide Layer - Exterior | c × l × t | 12.0 μm × 2.0 μm × 0.30 μm |
| Detector Active Volume | d × m × t | 1.996 mm × 1.996 mm × 628 μm |
| Electrode | w × l × h | 0.4 mm × 2.0 mm × 1.2 μm |
| Electrode Active Area | y × m | 0.392 mm × 1.996 mm |
| Substrate | s | 628 μm |
| Alignment Tolerance | b | 2.0 μm |

TABLE III

| Layer Name | Formula | Dimensions |
| --- | --- | --- |
| Oxide Layer - Active Side | (d + 2a) × l × t | 2.004 μm × 2.0 μm × 0.30 μm |
| Oxide Layer - Exterior | e × l × u | 12.0 μm × 2.0 μm × 0.30 μm |
| Detector Active Volume | d × m × s | 1.998 mm × 2.0 mm × 628 μm |
| Electrode | w × l × (h + t) | 0.4 mm × 1.996 mm × 1.2 μm |
| Electrode Active Area | y × m | 0.392 mm × 1.996 mm |
| Substrate | s | 628 μm |
| Alignment Tolerance | b | 2.0 μm |
| Antireflection Coating | u | 0.30 μm |

Figure 10A:
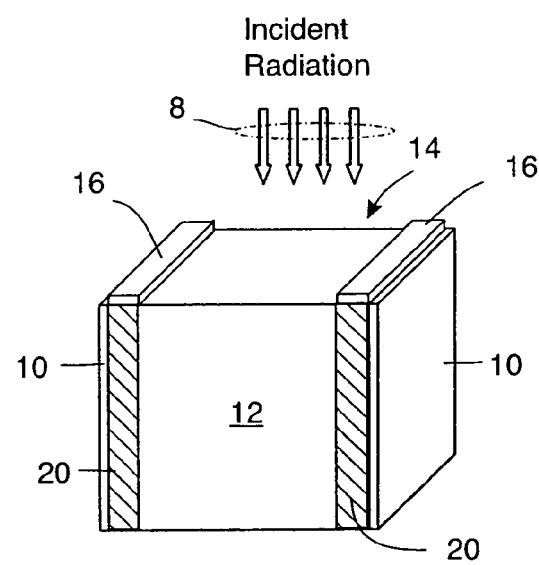
FIGS. 10a, 10b and 10c are perspective, plan and side section views, respectively, of a fifth embodiment of the present invention.
Figure 10B:
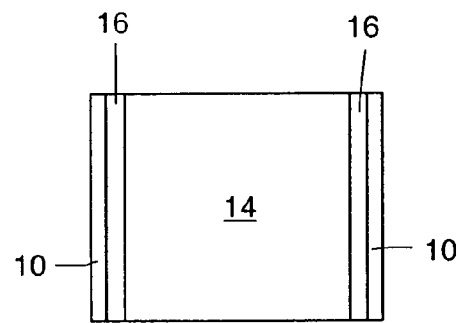
Figure 10C:
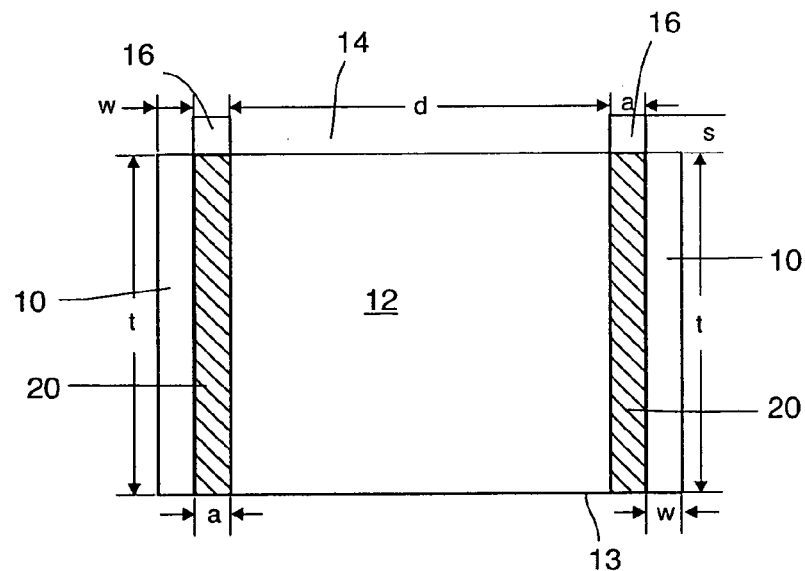

FIGS. 10*a*, 10*b* and 10*c* are perspective, plan and side section views, respectively, of an EMF-detector with side electrodes 10. FIG. 10*c* is enlarged compared to FIGS. 10*a* and 10*b*. This embodiment is preferably used when the light 8 from laser sources impinging the collection area 14 is below the bandgap of the material of the substrate 12.

Shields 16 are disposed adjacent each side electrode 10 on a top surface of the substrate 12 thereby defining shielded regions 20 immediately adjacent each side electrode 10. These shielded regions have a width "a" which covers the depletion region adjacent the side electrodes 10, yet is less than a diffusion length of a carrier in said substrate 12.

The length "t" that the light travels through the substrate 12 should be approximately equal to the absorption length of the incident photons whose energies for this embodiment are typically below or near the band gap and thus the absorption length is relatively long compared to the embodiments where the photon energies are typically above the band gap (e.g. the embodiments of FIGS. 2–9). To avoid spurious reflections, both the top surface 14 and its opposing bottom surface of the sensor shown in FIGS. 10*a*–10*c* may be provided with anti-reflection coatings.

Instead of shielding the depletion regions by the use of opaque shields 16 as shown in FIGS. 10*a*–10*c* to form the shielded region 20, the shielded regions 20 can be formed by a different mechanism altogether such as by ion implantation into the shielded regions 20. The ion implantation may be done using energetic protons having sufficient energy to cause dislocations in the substrate 12 immediately adjacent electrodes 10. Using ion implantation has an advantage in that the shielded region 20 can easily extend over the entire end face of the substrate 12 if the implantation is applied orthogonally to the major surfaces containing electrodes 10 to desensitize the collection volume (thereby forming shielded regions 20) immediately adjacent electrodes 10. When using a physical shield, such as shields 16, to define the shielded regions 20, the extent of the shielded region 20 along the axis of light 8 will depend on how well collimated light 8 happens to be. If light 8 is not well collimated, then using implantation-formed shielded regions 20 is preferable to using optical shields 16 to define the shielded regions 20, since the implantation-formed shielded regions 20 can extend further along the axis of light 8 and indeed can easily extend to a bottom surface 13 of the substrate 12. Of course, if implantation techniques are used to form the shielded regions 20 then optical shields 16 may be omitted.

In the earlier described embodiments, which are typically used when the photon energies of the incident light is above the band gap, then the fact that the incident light may not be well collimated is not particularly important as the absorption length is so short. Nevertheless, for the embodiments of FIGS. 2–9, the use of implantation-formed shielded regions 20 is a possible option.

In the foregoing description the word "opaque" has been used in connection with the shields 16. The word "opaque" is intended to refer any material which is does not transmit light and thus the term is intended embrace not only conventional opaque materials but also other materials, such as reflective materials, which also do not allow light to transmit through them.

From the foregoing description, it will be apparent that the present invention has a number of advantages, some of which have been described above, and others of which are inherent in the embodiments of the invention described above. Also, it will be understood that modifications can be made to the apparatus and method described above without departing from the teachings of subject matter described herein. As such, the invention is not to be limited to the described embodiments except as required by the appended claims.

The invention claimed is:

1. A photo-EMF detector comprising:
   (i) a substrate, said substrate having a first portion capable of receiving illumination;
   (ii) at least two electrodes contacting said substrate, said at least two electrodes being disposed on either side of, but spaced from, said first portion of said substrate; and
   (iii) at least two shielded regions in said substrate that inhibit generation of carriers in said shielded regions in response illumination, each of said shielded regions being disposed immediately adjacent to and associated with one of said at least two electrodes.

2. The photo-EMF detector of claim 1 wherein the at least two shielded regions in said substrate are formed by at least two optical shields for shielding the substrate from illumination, each said shield being associated with one of said at least two electrodes and each said shield being disposed over said substrate, adjacent said first portion and adjacent a point where its associated electrode contacts this substrate.

3. The photo-EMF detector of claim 2 wherein said shields comprise a layer of oxide.

4. The photo-EMF detector of claim 3 wherein at least one of said shields include a portion of at least one of said electrodes which is spaced from a surface of said substrate and which overhangs at least a portion of the layer of oxide.

5. The photo-EMF detector of claim 2 wherein at least one of said shields includes a portion of at least one of said electrodes which is spaced from a surface of said substrate and which overhangs said substrate to thereby shield a portion of the substrate from illumination.

6. The photo-EMF detector of claim 2 wherein said shields have a width that is less than a diffusion length of a carrier in said substrate.

7. The photo-EMF detector of claim 2 further comprising an anti-reflection layer disposed between said at least two electrodes and wherein at least one of said shields includes a portion of at least one of said electrodes which is spaced from a surface of said substrate and which overhangs at least a portion of the anti-reflection layer.

8. The photo-EMF detector of claim 2 wherein the at least two electrodes and said at least two optical shields occur in a common plane and on a surface of said substrate.

9. The photo-EMF detector of claim 2 wherein the at least two electrodes occur in parallel planes on different surfaces of said substrate.

10. The photo-EMF detector of claim 1 wherein said shielded regions have a width that is less than a diffusion length of a carrier in the first portion of said substrate.

11. The photo-EMF detector of claim 1 wherein the shielded regions are regions in said substrate of increased crystalline dislocation density compared to said first portion of said substrate, the increased crystalline dislocation density inhibiting the generation of carriers in said shielded regions in response illumination thereof.

12. The photo-EMF detector of claim 1 wherein the shielded regions are ion-implanted regions in said substrate that inhibit the generation of carriers in said shielded regions in response illumination thereof.

13. A method for reducing noise in a photo-EMF detector comprising:
   (i) forming first and second electrodes on a substrate, the substrate having a first region which generates carriers in response to illumination; and
   (ii) forming shielded portions in said substrate between the first region and the first and second electrodes, said shielded portions inhibiting generation of carriers in said shielded regions in response illumination of said first region.

14. The method as claimed in claim 13 wherein forming the shielded portions comprises placing opaque structures between said first portion of said substrate to be illuminated and points at which said first and second electrodes contact said substrate.

15. The method as claimed in claim 14 wherein at least one of said opaque structures is formed by at least a portion of said first electrode.

16. The method as claimed in claim 15 wherein said at least one of said opaque structures is formed by at least a portion of a layer of silicon dioxide.

17. The method as claimed in claim 16 wherein said layer of silicon dioxide is disposed on said substrate.

18. The method as claimed in claim 13 wherein forming the shielded portions comprises forming at least one of the first and second electrodes with an overhang to thereby define an overhanging gap between a portion of said substrate and said electrode.

19. The method as claimed in claim 13 further comprising placing an anti-reflection layer over said substrate and wherein forming the shielded regions comprises forming each of the first and second electrodes with an overhang that partially overhangs a different portion of the anti-reflection layer.

20. A photo-EMF detector comprising:
   (i) a semiconductor substrate, said semiconductor substrate having a first portion adapted for receiving illumination and generating carriers in response thereto;
   (ii) at least two electrodes in contact with said semiconductor substrate, said at least two electrodes being disposed on either side of, but spaced from, said first portion of said semiconductor substrate; and
   (iii) at least two shielded regions in said semiconductor substrate that inhibit generation of carriers therein in response to the illumination, each of said shielded regions occurring in a region between said at least two electrodes and said first portion.

21. The photo-EMF detector of claim 20 wherein the at least two electrodes are disposed in a co-planar relationship relative to each other and on a common surface of said semiconductor substrate.

22. The photo-EMF detector of claim 21 wherein the at least two shielded regions are formed by optical shielding structures disposed over and/or in contact with said common surface, the optical shielding structures inhibiting light from entering said at least two shielded regions in response to illumination of said first portion.

23. The photo-EMF detector of claim 22 wherein the optical shielding structures comprise optical shields disposed on said common surface.

24. The photo-EMF detector of claim 22 wherein the optical shielding structures comprise portions of said electrodes which overhang said common surface.

25. The photo-EMF detector of claim 20 wherein the at least two electrodes are disposed in a parallel relationship relative to each other and on opposing surfaces of said semiconductor substrate.

26. The photo-EMF detector of claim 25 wherein the at least two shielded regions are regions in said semiconductor substrate of increased crystalline dislocation density compared to said first portion of said substrate, the increased crystalline dislocation density inhibiting the generation of carriers in said shielded regions in response to illumination.

27. The photo-EMF detector of claim 25 wherein the shielded regions are ion-implanted regions in said semiconductor substrate that inhibit the generation of carriers in said shielded regions in response to illumination.

* * * * *

UNITED STATES PATENT AND TRADEMARK OFFICE
CERTIFICATE OF CORRECTION

PATENT NO.        : 7,176,542 B2
APPLICATION NO.   : 10/830540
DATED             : February 13, 2007
INVENTOR(S)       : Gilmore J. Dunning et al.

It is certified that error appears in the above-identified patent and that said Letters Patent is hereby corrected as shown below:

On the title page insert item (73), before the (*) Notice HRL Laboratories, LLC, 3011 Malibu Canyon Road, Malibu, California 90265-4799.

Signed and Sealed this

Twenty-fifth Day of March, 2008

JON W. DUDAS
*Director of the United States Patent and Trademark Office*